United States Patent
Freund et al.

[11] Patent Number: 6,123,800
[45] Date of Patent: Sep. 26, 2000

[54] METHOD AND APPARATUS FOR HANDLING ELEMENT ON AN ADHESIVE FILM

[75] Inventors: Joseph M. Freund, Fogelsville; George J. Przybylek, Douglasville; Dennis M. Romero, Allentown; John W. Stayt, Jr., Schnecksville, all of Pa.

[73] Assignee: Lucent Technologies, Inc., Holmdel, N.J.

[21] Appl. No.: 09/128,662

[22] Filed: Aug. 4, 1998

[51] Int. Cl.[7] .......................... H01L 21/301; B32B 31/18
[52] U.S. Cl. ........................ 156/344; 156/584; 438/464
[58] Field of Search .......................... 438/464; 156/344, 156/584

[56] References Cited

U.S. PATENT DOCUMENTS

| | | | |
|---|---|---|---|
| 4,296,542 | 10/1981 | Gotman | 438/464 X |
| 4,472,218 | 9/1984 | Avedissian et al. | 156/344 X |
| 4,711,014 | 12/1987 | Althouse | 438/464 X |
| 4,778,326 | 10/1988 | Althouse et al. | 414/786 |
| 4,859,269 | 8/1989 | Nishiguchi. | |
| 4,921,564 | 5/1990 | Moore | 438/464 X |
| 5,589,029 | 12/1996 | Matsui et al. | 156/344 |

*Primary Examiner*—Jeff H. Aftergut
*Attorney, Agent, or Firm*—Dickstein Shapiro Morin & Oshinsky LLP

[57] ABSTRACT

A system for handling semiconductor and electronic elements secured to an adhesive surface is provided. According to one aspect of the invention, a vacuum is applied through holes in a loading base. Under the influence of the vacuum, the adhesive film is pulled down toward the loading base and stretched around a pick rod so that the adhesive film is peeled away from the element. Thus, adhesive contact between the film and the element is reduced and a vacuum pick or collet is able to lift the element from the adhesive film with minimal force applied to the surface of the element.

26 Claims, 4 Drawing Sheets

METHOD AND APPARATUS FOR HANDLING ELEMENT ON AN ADHESIVE FILM

BACKGROUND OF THE INVENTION

1. Field of the Invention

The present invention relates generally to a system for handling elements, such as parts for use in the manufacture of semiconductor and electronic devices. The invention also relates to an apparatus and process for lifting semiconductor and electronic elements off of a flexible adhesive surface.

2. Description of the Related Art

The manufacture of semiconductor and other electronic devices generally includes steps such as sawing, scribing, breaking, sorting, inspecting, bonding, shipping, storage and additional processing. A number of tools and methods are employed to handle the delicate parts throughout such manufacturing processes. One such method involves the use of a film that contains a pressure sensitive adhesive mounted in a vacuum frame. In this method, the parts being processed are individually secured to the adhesive film by the force of the adhesive, and the film securing the parts is secured to the frame through the application of negative pressure applied through vacuum holes. This arrangement has proven efficient and effective in handling semiconductor and electronic parts throughout a variety of fabrication processes. Once processing is completed, however, significant problems exist in removing the fragile parts from the adhesive film.

A known system for removing parts from an adhesive film wedges a razor between the parts and the film by a scraping action. This process sometimes breaks the parts. The broken and unbroken parts must be sorted and placed manually into storage containers by an operator using a vacuum pick. Another problem with the razor scraping method is that part identity is lost with respect to position on the tape.

Another process for removing parts from an adhesive film includes the use of a probe, such as a needle or rod, which is applied to the bottom of the adhesive film to push the secured parts from the adhesive film. This technique, shown in U.S. Pat. No. 4,859,269 to Nishiguchi, is limited, however, due to the damage which may be caused to the parts by the force of the probe.

U.S. Pat. No. 4,778,326 to Althouse describes a texturized base member for supporting chips on a thin flexible film. To remove the chips, the film is drawn downward into the textured surface of the base member thereby reducing the surface contact between the chips and the film. This technique, however, requires costly tooling.

SUMMARY OF THE INVENTION

The present invention relates to an apparatus for removing elements from an adhesive film. The apparatus has a first surface for supporting a first element, a second surface for bending the film away from a second element, and a device for stretching the film around the second surface.

Further, the present invention relates to a method for handling an element secured to an adhesive film. The method includes the steps of: locating an element on a first surface; stretching the adhesive film around a second surface; and removing the element from the adhesive film.

An object of the invention is to provide a system for handling semiconductor and electronic elements, including wafers, die, substrates, chips, bars and the like, which are retained in a desired position on a carrier film during handling, yet need to be reliably and easily removed from the film.

In one aspect of the invention, a loading base has vacuum holes dispersed on a top surface and a thin lift mesa (or pick rod) that spans the loading base. Semiconductor (or electronic) elements are adhered to a flexible film. One of the elements is located directly above the pick rod. A vacuum is applied through the vacuum holes, and the adhesive film is pulled down toward the loading base under the influence of the vacuum. As the film is pulled to the loading base, it stretches around the pick rod and partially peels away from the element, reducing adhesion between the film and the element. The element is supported along its length by the pick rod which spans the loading base to prevent part breakage due to bending. A vacuum pick or collet then lifts the element off with minimal force applied to the surface of the element.

These and other features and advantages of the invention will become apparent from the following detailed description of preferred embodiments of the invention.

DETAILED DESCRIPTION OF PREFERRED EMBODIMENTS

Figure 1:
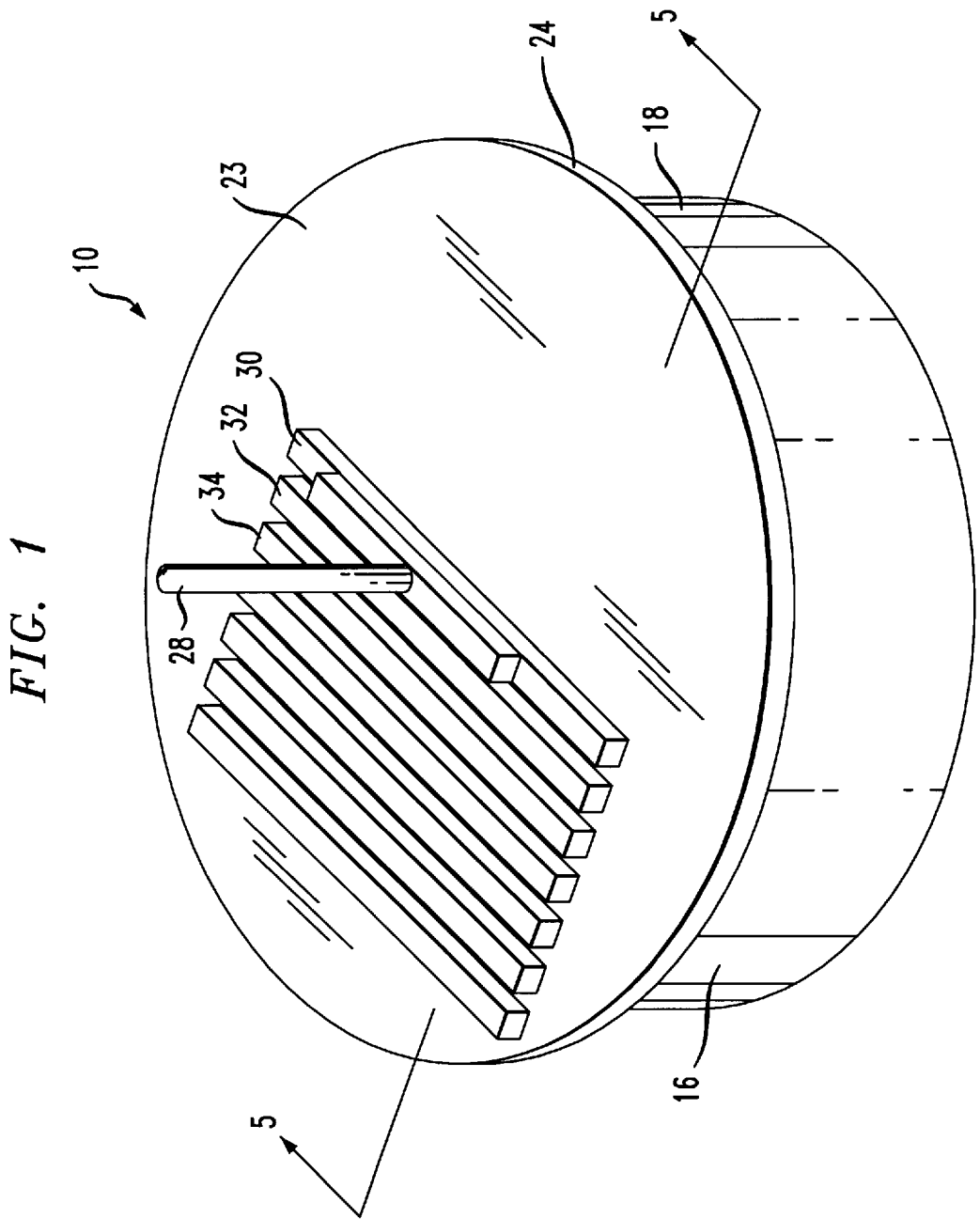
FIG. 1 is a perspective view of a handling system constructed in accordance with a preferred embodiment of the present invention.

Referring now to the drawings, where like elements are designated by like reference numerals, there is shown in FIG. 1 a handling system 10 constructed in accordance with the present invention. The system 10 includes a carrier 16, movable adhesive film 24, and a vacuum collet 28 for removing bars 30, 32, 34 from the top surface 23 of the adhesive film 24. The bars 30, 32, 34 may be of very small size. The bars 30, 32, 34 may require support along their lengths during removal from the adhesive film 24.

Figure 2:
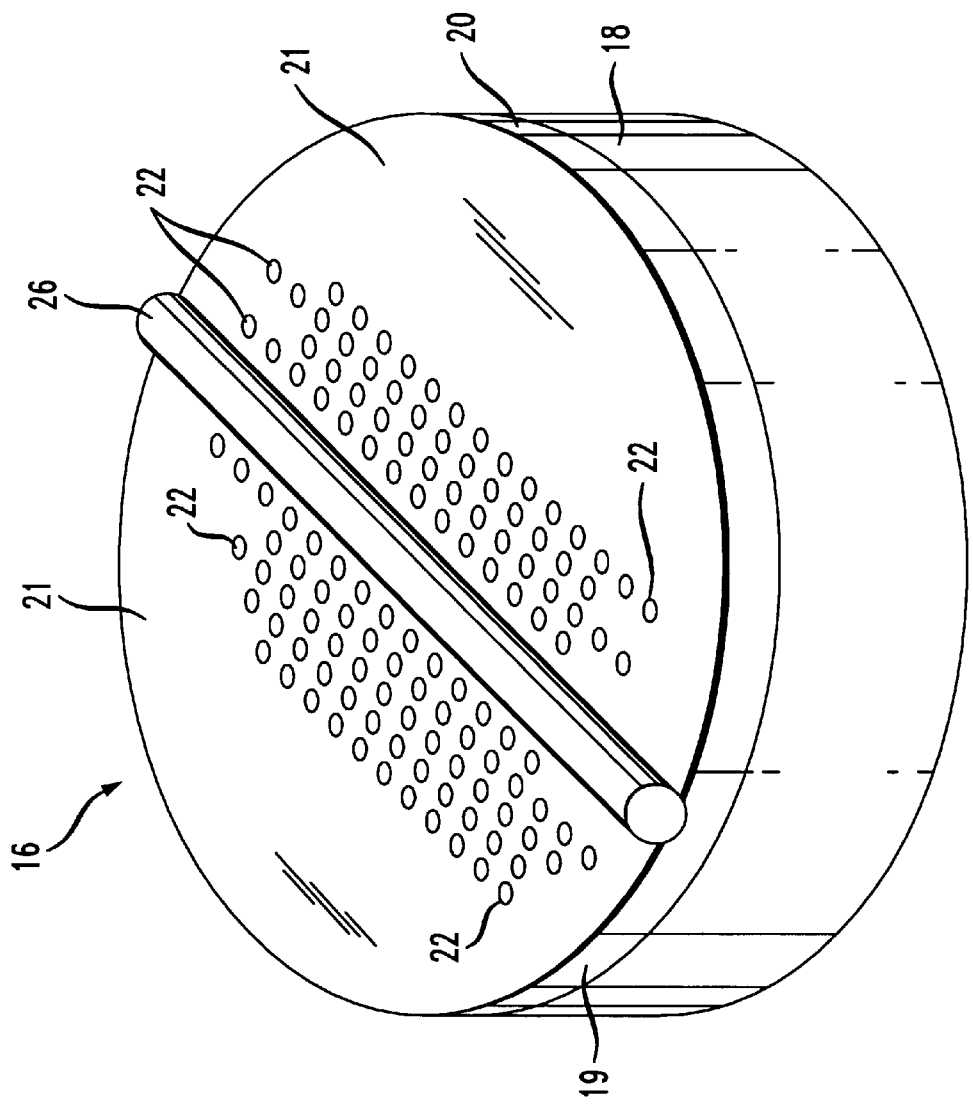
FIG. 2 is a perspective view of the carrier for the handling system of FIG. 1.

Referring now to FIG. 2, the carrier 16 has a loading base 20 formed of a suitable rigid material such as glass, plastic, metal, or the like. The loading base 20 is porous or permeable to allow for the passage of air therethrough. In the illustrated arrangement, the loading base 20 has vacuum holes 22. Negative and positive pressure may be applied through the holes 22 to the top surface 21 of the loading base 20. The loading base 20 may have a cylindrical side wall 19. The top surface 21 may be essentially planar.

The loading base 20 is located on a vacuum chuck 18. The vacuum chuck 18 is adapted to provide the desired pressure to the surface 21 of the loading base 20 through the vacuum holes 22.

A pick rod (or lift mesa) 26 is mounted in the top surface 21 of the loading base 20. As discussed in more detail below, the pick rod 26 may be used as a lift surface. The top surface of the pick rod 26 is elevated above the loading base surface 21. The pick rod 26 may be composed of any suitable rigid material such as glass, plastic, metal, or the like. The pick rod 26 should preferably be at least as long as the elements 30-34 on the film 24. According to a preferred embodiment, the pick rod 26 has a single, continuous cylindrical surface which spans the length of the loading base 20. Alternatively, the pick rod 26 may be any shape which enables the smooth movement of a transported part from the surface 21 of the loading base 20 to a location directly above the pick rod 26.

Figure 3:
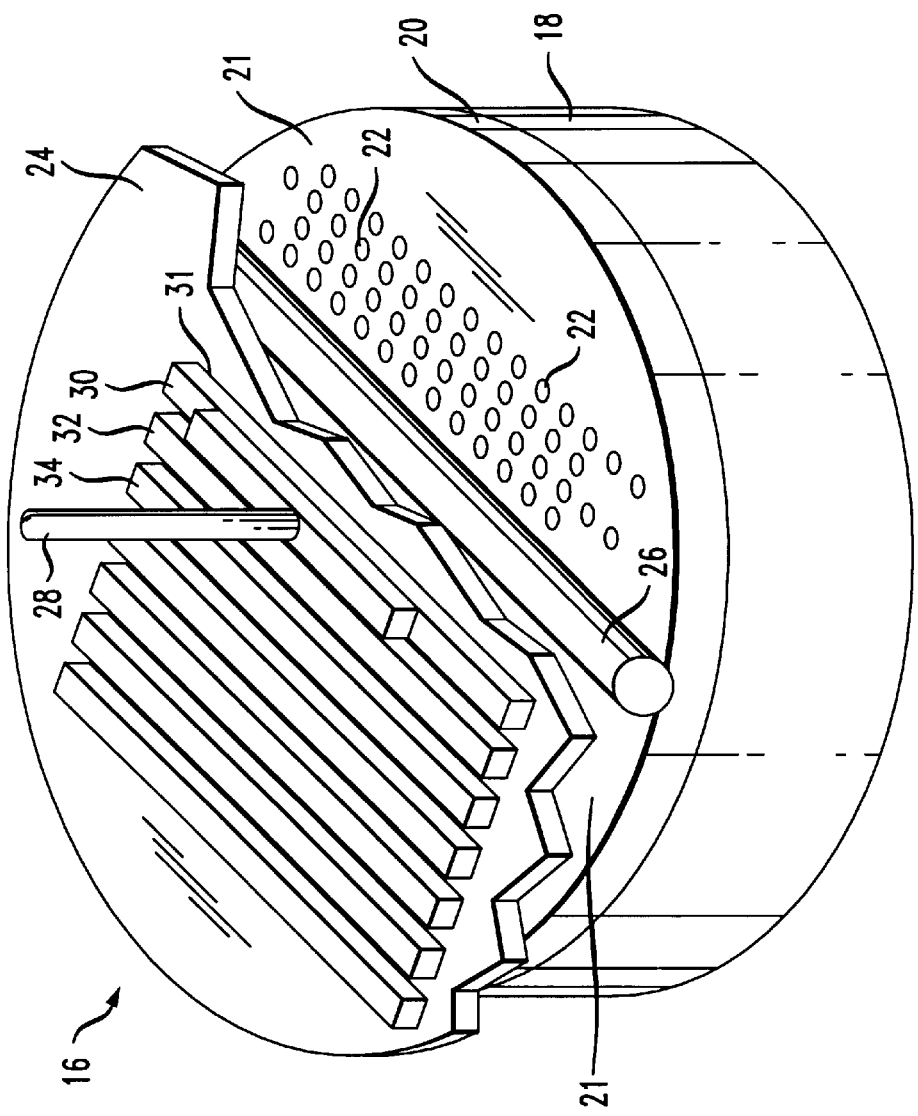
FIG. 3 is a perspective view of the handling system of FIG. 1, with a portion of the adhesive film broken away to show the top of the carrier.

According to a preferred embodiment, the radius of the pick rod 26 is chosen so that the pick rod 26 has minimal surface area in contact with the transported part 30 (FIG. 3) but sufficient surface area to adequately support the part 30. Accordingly, for sturdier parts, a narrow pick rod 26 may be used; while for more fragile parts, such as semiconductor bars, a wider pick rod 26 may be required.

Figure 4:
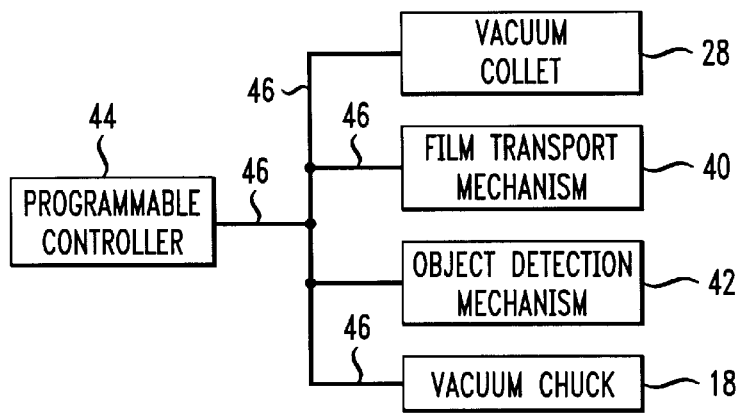
FIG. 4 is a schematic diagram of the control elements for the handling system of FIG. 1.

Referring to FIG. 4, a film transport mechanism 40 is provided to transport the adhesive film 24 in a step-wise fashion across the surface 21 of the loading base 20. Additionally, an object detection mechanism 42 and controller 44 are provided for coordinating and controlling the removal of the parts 30, 32, 34 from the adhesive film 24. The controller 44 communicates with the vacuum collet 28, the film transport mechanism 40, the object detection mechanism 42, and the vacuum chuck 18 through signal lines 46.

Figure 5:
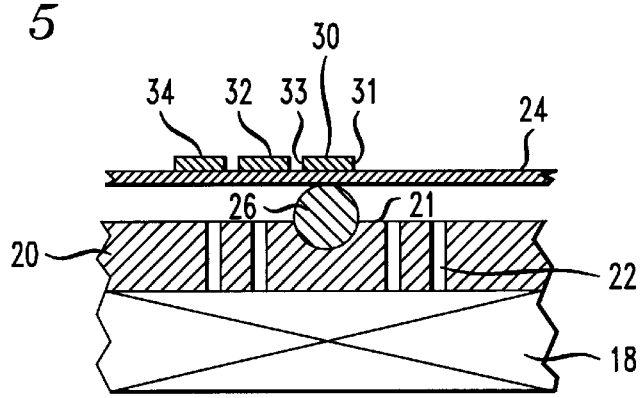
FIG. 5 is a partial cross-sectional view of the handling system of FIG. 1, taken along the line 5—5, showing a first step in a process of removing an element from the adhesive film.

In operation, the adhesive film 24 securing the bars 30, 32, 34 is moved by the transport mechanism 40 to the position shown in FIG. 5. In the FIG. 5 position, a first bar 30 is positioned directly over the center of the pick rod 26. The bar 30 is parallel to the axis of the pick rod 26. The object detection mechanism 42 determines and confirms the proper positioning of the bar 30. At this point, the bar 30 is fully supported along its length by the pick rod 26. The bar 30 is adhesively secured to the film 24. The film 24 is located between the bar 30 and the pick rod 26.

Figure 6:
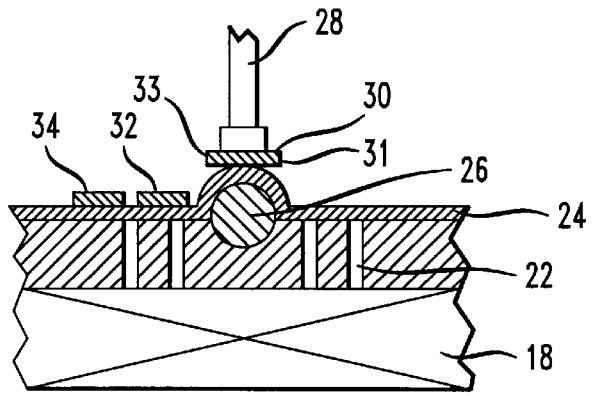
FIG. 6 is a partial cross-sectional view like FIG. 5, showing a second step in the process of removing an element from the adhesive film.

Once it is determined that the bar 30 is properly positioned, a vacuum is applied to the surface 21 of the loading base 20 by the vacuum chuck 18 through vacuum holes 22. As shown in FIG. 6, under the influence of the vacuum created by the vacuum chuck 18, the adhesive film 24 is pulled down toward the load base 20. The vacuum causes the portion of the adhesive film 24 positioned over the pick rod 26 to stretch around the pick rod 26 and peel away from the edges 31, 33 of the bar 30. That is, the vacuum causes the film 24 to assume the position shown in FIG. 6. In the FIG. 6 position, the bar 30 has minimal adhesive contact with the adhesive film 24. The vacuum bends the film 24 away from the bar 30. Consequently, minimal force is necessary to remove the bar 30 from the film 24. The bar 30 is removed from the adhesive film 24 using the vacuum collet 28. Other conventional vacuum pick-up devices as well as tweezers or the like may be used instead of the vacuum collet 28.

Once removal of the bar 30 is accomplished and confirmed by the object detection mechanism 42, the vacuum applied to the load surface 21 is removed, and the film transport mechanism 40 positions the next bar 32 over the pick rod 26.

The bar removal process is then repeated. The film 24 is drawn down upon the pick rod 26 by vacuum. The bar 32 is then removed by the collet 28. And the process is repeated until all of the bars 30, 32, 34 have been safely removed, one by one, from the adhesive film 24.

While the invention has been described with regard to rectangular semiconductor bars, the invention may be used to handle and/or process a variety of semiconductor and electronic parts and components. For example, laser bars, light emitting diodes (LED's) and completed computer chips may be handled using the present invention.

Further, although the invention has been described with specific reference to a cylindrical pick rod 26 spanning a circular wafer holding table 16, the physical arrangement of the present invention may be varied in accordance with the dimensions and strengths of the elements being handled. Moreover, the process described above in detail is but one method of many that could be used. For instance, the pick rod 26 may be made adjustable so that its height above the surface 21 of the carrier 22 may be varied during the removal process. Additionally, the vacuum source 18 may be made reversible so as to provide a positive pressure to the surface 21 of the loading base 22, to assist in moving the adhesive film 24. Further, the adhesive film 24 could be made stationary and the pick rod 26 could be designed to move across the surface 21 of the loading base 22.

The above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A method of handling elements secured to an adhesive film, said method comprising the steps of:

locating said adhesive film over a first surface such that a first element is located on a rod mounted within and elevated above said first surface;

moving said adhesive film toward said first surface such that only a singular contact portion remains between the first element and said adhesive film;

removing said first element from said adhesive film; and subsequently, moving said adhesive film to locate a second element over said rod.

2. The method of claim 1, further comprising the step of detecting the position of said first element.

3. The method of claim 2, wherein said rod is at least as long as said first and second elements.

4. An apparatus for handling elements secured to an adhesive film, said apparatus comprising:

an upper surface including a plurality of vacuum holes;

a rod mounted within and elevated above said upper surface;

a vacuum device connected to said holes and adapted to apply suction to the adhesive film such that only a singular contact portion remains between the elements and the adhesive film; and a removal device for removing the elements from the adhesive film.

5. The apparatus of claim 4, further comprising a transport mechanism for moving the adhesive film.

6. The apparatus of claim 5, wherein said rod is shaped to reduce contact between the adhesive film and an element supported thereon.

7. The apparatus of claim 6, wherein said rod is a cylindrical rod.

8. The apparatus of claim 4, further comprising a position detection apparatus for detecting positions of the elements.

9. The apparatus of claim 8, wherein said position detection apparatus comprises an object detection mechanism and a controller.

10. A method of handling an element secured to an adhesive surface, said method comprising the steps of:

providing a rod mounted within and elevated above an upper surface;

locating said adhesive film on said upper surface;

moving said adhesive film across said upper surface so that said element is positioned over said rod;

exerting a force on said adhesive film so that said adhesive film is stretched around said rod such that only a singular contact portion remains between said element and said adhesive film; and subsequently, removing said element from said adhesive film.

11. The method of claim 10, wherein said step of exerting said force includes the step of applying suction to said upper surface.

12. The method of claim 11, wherein said rod is shaped to reduce contact between said adhesive film and said element.

13. The method of claim 12, wherein said rod includes a cylindrical rod mounted within said upper surface.

14. The method of claim 13, wherein said element is a rectangular semiconductor product.

15. An apparatus for removing fragile parts from an adhesive film, said apparatus comprising:

a first surface for supporting a first fragile part;

a rod mounted within and elevated above said first surface for bending the film away from a second fragile part such that only a singular contact portion remains between the first fragile part and the adhesive film, wherein said rod is a single, continuous surface at least as long as the second fragile part; and a device for applying a force to bend the film.

16. The apparatus of claim 15, wherein said second surface is shaped to reduce the area of contact between the adhesive film and the second fragile part.

17. The apparatus of claim 16, wherein said second surface is cylindrical.

18. The apparatus of claim 15, wherein said device includes a source of suction.

19. The apparatus of claim 15, further comprising a position detection apparatus for detecting a position of the first fragile part.

20. The apparatus of claim 19, wherein said position detection apparatus comprises an object detection mechanism and a controller.

21. An apparatus for removing elements from an adhesive film, said apparatus comprising:

a first surface for supporting the adhesive film;

a second surface for bending the adhesive film away from a secured element said second surface consisting of a rod mounted within and elevated above said first surface; and a device for stretching the adhesive film around said second surface.

22. The apparatus of claim 21, wherein said second surface is shaped to reduce contact between the adhesive film and the secured element.

23. The apparatus of claim 21, wherein said second surface spans the length of said first surface.

24. The apparatus of claim 21, wherein the rod has a circular cross-section.

25. The apparatus of claim 21, wherein said device is a vacuum device adapted to exert a force on the adhesive film.

26. The apparatus of claim 25, wherein said first surface includes openings through which said vacuum device exerts a force on the adhesive film.

* * * * *